United States Patent
Pevzner et al.

(10) Patent No.: US 10,999,938 B1
(45) Date of Patent: May 4, 2021

(54) METHOD OF WIRE BONDING A FIRST AND SECOND CIRCUIT CARD

(71) Applicant: Raytheon Company, Waltham, MA (US)

(72) Inventors: Mikhail Pevzner, Woburn, MA (US); Donald G. Hersey, Beverly, MA (US); Gregory G. Beninati, Salem, NH (US); Thomas J. Tellinghuisen, Pelham, NH (US); James E. Benedict, Chelmsford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/861,326

(22) Filed: Apr. 29, 2020

(51) Int. Cl.
*H05K 3/34* (2006.01)
*H05K 1/14* (2006.01)

(52) U.S. Cl.
CPC .......... *H05K 3/3436* (2013.01); *H05K 1/144* (2013.01); *H05K 2201/09845* (2013.01)

(58) Field of Classification Search
CPC .......... H01L 23/52; H01R 43/04; H05K 3/30; H05K 1/144; H05K 3/3436; H05K 2201/09845
See application file for complete search history.

(56) References Cited

U.S. PATENT DOCUMENTS

| | | | | | |
|---|---|---|---|---|---|
| 3,400,358 | A | * | 9/1968 | Byrnes | H01R 13/33 439/75 |
| 4,630,172 | A | * | 12/1986 | Stenerson | H01L 21/4857 257/713 |
| 4,953,060 | A | * | 8/1990 | Lauffer | H01L 23/49827 257/713 |
| 5,014,419 | A | * | 5/1991 | Cray | H01R 12/523 29/830 |
| 5,241,454 | A | * | 8/1993 | Ameen | H01L 23/4985 174/255 |
| 5,266,912 | A | * | 11/1993 | Kledzik | H01L 23/64 174/267 |
| 5,485,039 | A | * | 1/1996 | Fujita | H01L 23/473 257/774 |
| 5,854,534 | A | * | 12/1998 | Beilin | H01L 23/49838 257/691 |
| 6,729,026 | B2 | * | 5/2004 | Garcia | H01R 43/28 29/33 F |
| 7,180,167 | B2 | * | 2/2007 | Partridge | H01L 23/3114 257/686 |
| 7,679,916 | B2 | * | 3/2010 | Orr | F28F 3/12 361/719 |

* cited by examiner

*Primary Examiner* — Carl J Arbes
(74) *Attorney, Agent, or Firm* — Daly, Crowley Mofford & Durkee, LLP (57) ABSTRACT

Methods and apparatus for an assembly having first and second circuit cards mated together with a ball stack on the first circuit card extending into a through hole in the second circuit card. A wirebond connects the first ball stack to a bond pad on the first surface of the second circuit card forming a low profile connector-less interconnect. The ball stack comprises at least two balls stacked on top of each other and bonded to each other, wherein the balls are generated from wire.

5 Claims, 9 Drawing Sheets

METHOD OF WIRE BONDING A FIRST AND SECOND CIRCUIT CARD

BACKGROUND

As is known in the art, circuit boards and other structures may need to be mated together. Mating circuit boards may require connections from one circuit board to another. Conventional systems for providing an electrical connection between a top surface of the first board and a top surface of a second board, which do not face other in the assembly, may not be effective or efficient. Interconnects, such as RF interconnects, may suffer from similar issues, with additional concerns due to impedance matching.

SUMMARY

Embodiments of the invention provide method and apparatus for providing electrical and/or mechanical connections between structures to form an assembly using ball stacks formed from wire by wirebonding equipment. In some embodiments, ball stacks are used to form a connection from a first circuit board to a second circuit board with a wirebond connected to the ball stack. One or more ball stacks can also determine an offset or separation distance between the circuit boards. In some embodiments, ball stacks can be formed to provide signal and ground connections for an interconnect, such as an RF coaxial interconnect. In other embodiments, locating features on a first structure comprise ball stacks that align with complementary features on a second structure where the locating features ensure proper orientation of the first and second structures, which can be secured together. In some embodiments, ball stacks on a circuit card or other structure can ensure proper orientation and seating with a housing for example. In other embodiments, a housing can include ball stacks located to ensure proper alignment with a gasket, for example.

Example embodiments can include ball stacks for use in various structures for electrical and/or mechanical features for a variety of needs including thermal management, electro-mechanical interfaces, electrical/RF interconnects, alignment, e.g., poka yoke features, and keying features. The use of ball stacks may eliminate the need for certain components in conventional mechanisms, such as stand-offs, washers, connectors, isolation pins, etc., which incur costs, material management/logistics overhead, decreased production yields, and the like.

In one aspect, an assembly comprises: a first circuit card having first and second surfaces and including a first ball stack extending from the first surface of the first circuit card; a second circuit card having first and second surfaces and including a through hole, wherein the second circuit card is mated to the first circuit card, such that the first surface of the first circuit card faces the second surface of the second circuit card, wherein the first ball stack extends into the through hole; and a wirebond connecting the first ball stack to a bond pad on the first surface of the second circuit card, wherein the first ball stack comprises at least two balls stacked on top of each other and bonded to each other, wherein the balls are generated from wire.

An assembly can further include one or more of the following features: further ball stacks extending from the first surface of the first circuit card and further wirebonds connecting the further ball stacks to respective bond pads on the first surface of the second circuit card, at least one further circuit card between the first and second circuit cards, the bond pad on the first surface of the second circuit card is adjacent to the though hole and the first ball stack, the bond pad on the first surface of the second circuit card is proximate an edge of the second circuit card, the wirebond is directly connected from the first ball stack to the bond pad on the first surface of the second circuit card such that the wirebond has a substantially shortest length, the wirebond is routed from the first ball stack to the bond pad on the first surface of the second circuit card such that the wirebond has at least one substantially ninety degree bend, the assembly provides an electrical interconnect of the first and second circuit boards, the interconnect comprises a coaxial connection, the first ball stack provides a signal connection and further including a further through hole and a further ball stack configured to provide a connection to a ground layer, the first ball stack has a diameter that can range from about 1 mil to about 30 mils, the first ball stack has a height range that can range from about 2 mil to about 90 mil, the first ball stack and the through hole are located to force the first and second circuit cards to be mated in a particular orientation for poka-yoke keying, and/or at least one second ball stack extending from first surface of the first circuit card, wherein a distance between the first and second circuit cards corresponds to a stand-off height defined by a height of the at least one second ball stack.

In another aspect, a method comprises employing a first circuit card having first and second surfaces and including a first ball stack extending from the first surface of the first circuit card; employing a second circuit card having first and second surfaces and including a through hole, wherein the second circuit card is mated to the first circuit card to form an assembly, such that the first surface of the first circuit card faces the second surface of the second circuit card, wherein the first ball stack extends into the through hole; and employing a wirebond to connect the first ball stack to a bond pad on the first surface of the second circuit card, wherein the first and second ball stacks comprise at least two balls stacked on top of each other and bonded to each other, wherein the balls are generated from wire.

A method can further include one or more of the following features: further ball stacks extending from the first surface of the first circuit card and further wirebonds connecting the further ball stacks to respective bond pads on the first surface of the second circuit card, at least one further circuit card between the first and second circuit cards, the bond pad on the first surface of the second circuit card is adjacent to the though hole and the first ball stack, the bond pad on the first surface of the second circuit card is proximate an edge of the second circuit card, the wirebond is directly connected from the first ball stack to the bond pad on the first surface of the second circuit card such that the wirebond has a substantially shortest length, the wirebond is routed from the first ball stack to the bond pad on the first surface of the second circuit card such that the wirebond has at least one substantially ninety degree bend, the assembly provides an electrical interconnect of the first and second circuit boards, the interconnect comprises a coaxial connection, the first ball stack provides a signal connection and further including a further through hole and a further ball stack configured to provide a connection to a ground layer, the first ball stack has a diameter that can range from about 1 mil to about 30 mils, the first ball stack has a height range that can range from about 2 mil to about 90 mil, the first ball stack and the through hole are located to force the first and second circuit cards to be mated in a particular orientation for poka-yoke keying, and/or at least one second ball stack extending from first surface of the first circuit card, wherein a distance between the first and second circuit cards corresponds to a stand-off height defined by a height of the at least one second ball stack.

In a further aspect, an assembly comprises: a first circuit card having first and second surfaces and including a first ball stack extending from the first surface of the first circuit card; and a second circuit card having first and second surfaces, wherein the second circuit card is mated to the first circuit card such that the first surface of the first circuit card faces the second surface of the second circuit card, wherein a distance between the first and second circuit cards corresponds to a stand-off height defined by a height of the second ball stack, wherein the first ball stack comprises at least two balls stacked on top of each other and bonded to each other, wherein the balls are generated from wire.

BRIEF DESCRIPTION OF THE DRAWINGS

The foregoing features of this invention, as well as the invention itself, may be more fully understood from the following description of the drawings in which:

FIG. 6A is an exploded view, FIG. 6B is semi-transparent side view.

DETAILED DESCRIPTION

Figure 1A:
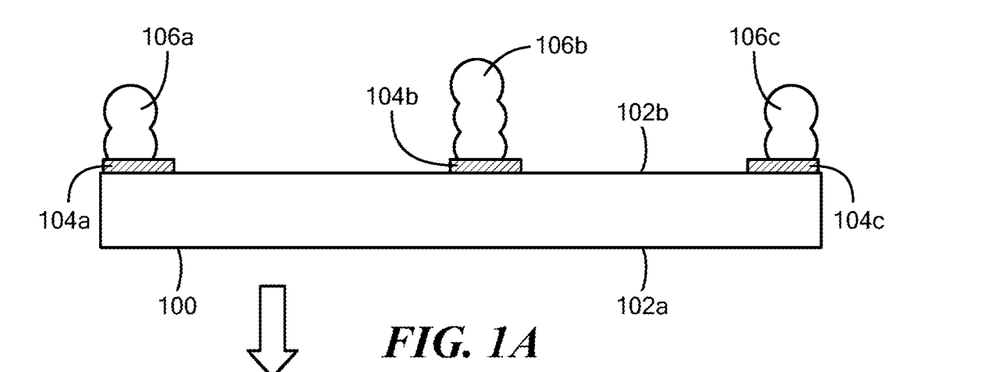
FIG. 1A shows a side view of a first circuit card having ball stacks on a surface of the first circuit card.
Figure 1B:
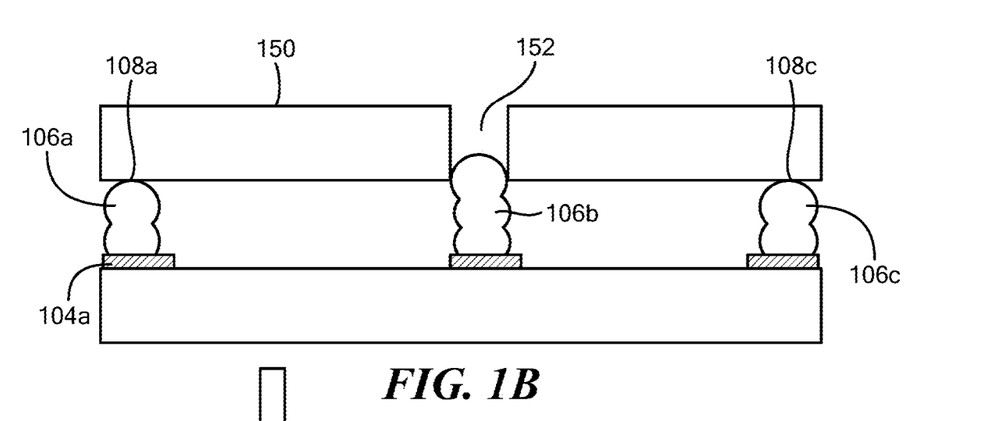
FIG. 1B is a cross-sectional view of the first circuit card of FIG. 1A mated with a second circuit card to form as assembly.
Figure 1C:
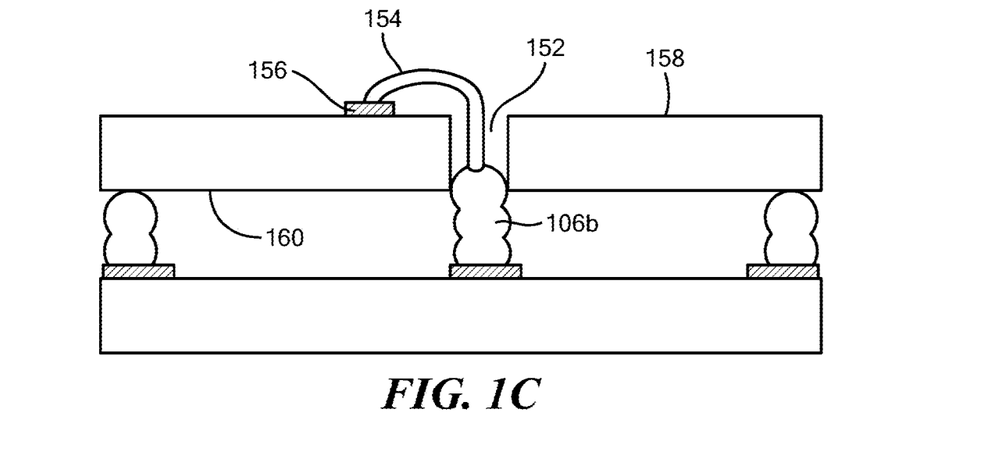
FIG. 1C is a cross-sectional view of the assembly of FIG. 1B with a wirebond connecting a ball stack to a pad on the second circuit card where the z-axis stack height provides access for the wire bonder.

FIGS. 1A, 1B, and 1C show example assembly steps for providing a low profile board interconnect. Example boards can comprise DC printed circuit boards (PCBs), RF boards, digital PCBs, and the like.

As used herein, the term "circuit card" should be construed broadly to include boards with or without ICs, radiators, PWBs, substrates, such as alumina substrates, and the like.

As shown in FIG. 1A, a circuit card 100 has first and second opposing surfaces 102a,b. The first surface 102a of the circuit card 100 includes a series of first, second, and third bond pads 104a,b,c, where first and third bond pads 104a,c are located at edges of the circuit card and the second bond pad 104b is located within an inner region of the circuit card. A first ball stack 106a is formed on the first bond pad 104a and a third ball stack 106c is formed on the third bond pad 104c. A second ball stack 106b is formed on the second bond pad 104c of the circuit card 100.

As shown in FIG. 1B, a second circuit card 150 can be mated to the first circuit card 100. The first ball stack 106a on the first bond pad 104a of the first circuit card 100 can be aligned and connected to an optional first bond pad 108a of the second circuit card 150. Similarly, the third ball stack 106c of the first circuit card 100 can be aligned with and connected to an optional bond pad 108c of the second circuit card 150.

In embodiments, the first and third ball stacks 106a,c are configured for mechanical applications and the second ball stack provides an electrical function. It is understood that any suitable technology can be used to provide supports to define a distance between the first and second circuit cards. In some embodiments the first and third ball stacks 106a,c can provide an electrical function. In embodiments, the connections 108a,c to the ball stacks can include an adhesive, such as conductive epoxy. It is also understood that the stacks 106a and 108c are optional altogether, as the offset may not be required if, for example, the first printed circuit board 100 and second printed circuit board 150 are laminated directly to each other.

In the illustrated embodiment, the second circuit card 150 includes a through hole 152 that can be aligned with the second ball stack 106b extending up from the first circuit card 100. In embodiments, the second ball stack 106b has a height that is greater than the first and second ball stacks 104a,c in order to extend into the through hole 152 of the second circuit board 150 to provide access for the top side interconnect scheme, such as using the wire bond equipment or even manual soldering iron. In embodiments, the location of the second ball stack 106b on the first circuit card and the location of the through hole 152 on the second circuit card ensure that the first and second circuit cards 100, 150 can be mated together in a particular orientation.

As shown in FIG. 1C, in embodiments, a wirebond 154 can be connected at one end to the second ball stack 106b and at the other end to a bond pad 156 on a top surface 158 of the second circuit card. The height of the second ball stack 106b should be sufficient in one embodiment to allow a wire bonding system to attach the wirebond 154 to the second ball stack 106b. In another embodiment, a manual soldering iron, for example, can be used. In general, access is provided to the electrical terminal by bringing that terminal up where it can be reached.

In the illustrated embodiment, the second ball stack 106b provides elevation of the electrical terminal from the surface of the first circuit board 100 to allow automated wirebond equipment to reach that electrical terminal. Without the second ball stack 106b, automated wirebond equipment may not reach the electrical connection through a relatively small aperture.

In embodiments, the through hole 154 and the bond pad 156 can located in any practical location. The through hole 154 and/or second bond pad 104b can be located based on required layout and real estate considerations for the first and/or second circuit board. The bond pad 156 on the top surface of the second circuit board 150 may be located relatively close or far away from the through hole 152 due to similar considerations of real estate and board layout. Pads could be located as close as the edge of the through hole and as far as far away as another corner of a printed wiring board.

Figure 1D:
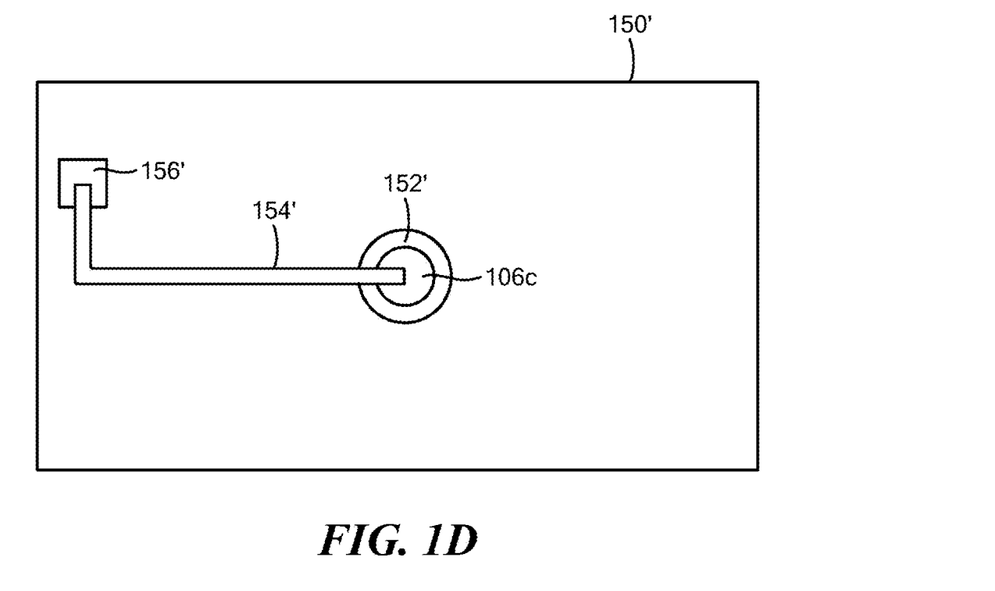
FIG. 1D is a top view of an assembly in which the wire from the lower board is spooled and routed on the top board to a distant/remote pad.
Figure 1E:
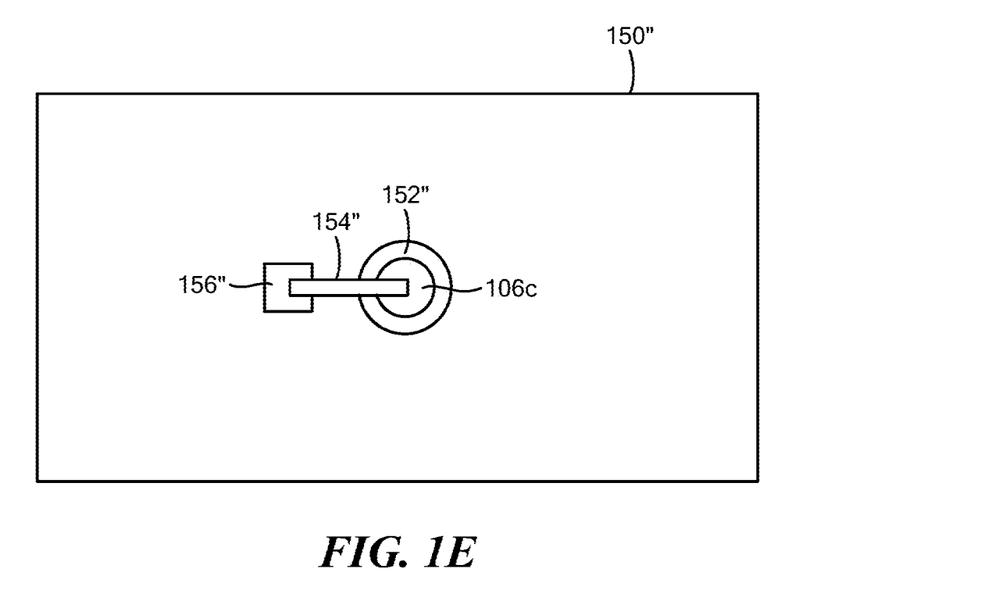
FIG. 1E is a top view of an assembly in which the wire from the lower board is spooled and routed on the top board to a relatively close pad.

As shown in FIG. 1D, the bond pad 156' on the top surface of the second circuit board 150' may be relatively far away from the through hole 152'. FIG. 1E shows the bond pad 156" on the top surface of the second circuit board 150" relatively close to the through hole 152' for a shorter wirebond 154". FIG. 1D shows a wirebond 154' extending from a ball stack 106c to a bond pad 156' located near an edge of the second circuit board. While illustrated having a ninety degree angle, in embodiments, the wirebond 154' may be more of an "as the crow flies" path from the pad 156' to the ball stack 106c. For example, a manual bonder can be used to bond to the stack, and then spool out the wire as needed to form a desire routing of the wirebond. A manual tool, for example, can be used to form the thermocompression bond on pad 156'. In embodiments, the wire bond 154' can be staked, coated, encapsulated, etc., to provide structural integrity and electrical insulation.

It is understood that the term mated should be construed broadly to include circuit cards that are part of an assembly. For example, an assembly can include a stack of four circuit cards with each of the four cards considered mated to each other. If first, second, third, and fourth circuits cards are stacked in order, a first circuit can include a ball stack connected to a wirebond to make an electrical connection to the top and/or bottom surface of the third circuit card. The first and third circuit cards are considered mated to each other, even if they are not next to each other in the stack of circuit cards. The assembly of circuit cards or printed wiring board layers can be formed using mechanical fasteners or using lamination process, used in printed wiring board industry to form circuit card assemblies from individual layers of substrate with copper and bond film material.

In embodiments, the second circuit board 150 can have connections and bond pads on the top surface 158 and/or a bottom surface 160 to interconnect with bond pads on the first circuit board.

It is understood that any practical number of ball stacks, through holes, wirebonds, and the like can be used to meet the needs of a particular application. A desired number of offset ball stacks can be used to maintain an offset or separation distance between first and second circuit boards.

In embodiments, a wire bonding system can be used to form ball stacks with one ball formed on top of another in order to form a ball stack of desired height. The cross section of the ball stacks can also have a desired area. For generally round ball stacks, a desired diameter can be implemented to meet the needs of a particular application.

As used herein, the term "ball stack" refers to a stack of at least two balls stacked on top of each other and bonded to each other where the balls are generated from wire that is melted to form the balls by wire bonding equipment, as described more fully below.

Figure 2A:
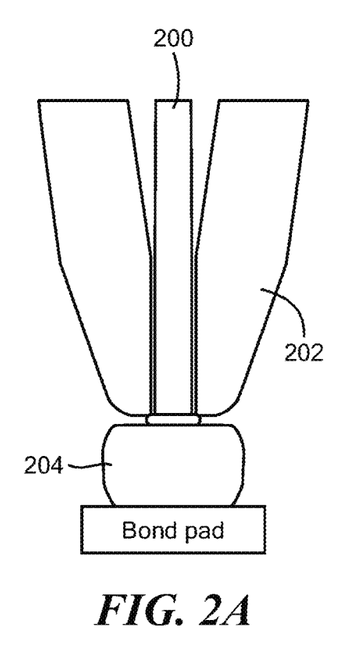
FIGS. 2A and 2B are schematic representations of wire-bonding equipment to form ball stacks, such as the ball stacks of FIGS. 1A, 1B, and 1C.
Figure 2B:
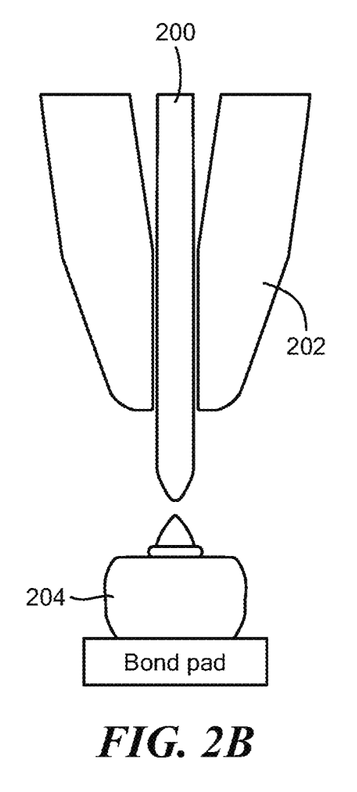
Figure 2C:
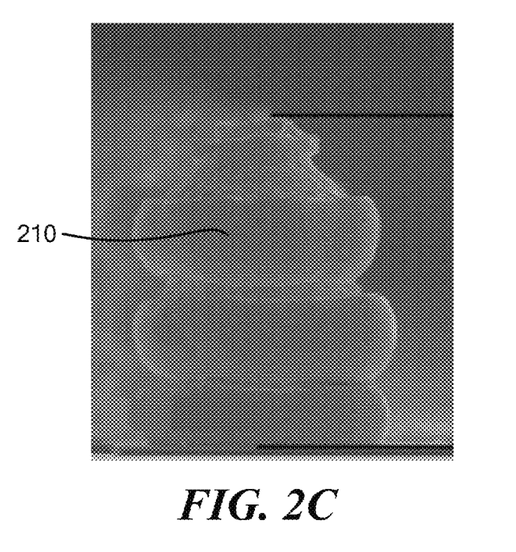
FIG. 2C is a pictorial representation of an example ball stack.

FIGS. 2A and 2B show a portion of a wire bonding system to form ball stacks or stud bumps and FIG. 2C shows an example ball stack formed by the wire bonding system. A wire 200 is fed through a needle-like tool 202 which may be referred to as a capillary. A high-voltage electric charge is applied to the wire 200 to melt the wire at the tip of the capillary 202. The tip of the wire 200 forms into a ball 204 because of the surface tension of the molten metal. The ball 204 quickly solidifies and the capillary 202 is lowered to the surface of the chip, which is typically heated to at least 125° C. The machine then pushes down on the capillary 202 and applies ultrasonic energy with an attached transducer. The combined heat, pressure, and ultrasonic energy create a weld between the metal ball and the surface of the chip. A series of balls, which may be referred to as ball stacks 210 or stud bumps, may be stacked on top of each other, as shown in FIG. 2C. The stud bumps can be formed having any practical dimensions to meet the requirements of a particular application.

In embodiments, stud bumps can have a diameter that can range from about 1 mil to about 30 mils. In example embodiments, stacked balls have an average diameter in the order of 5 mil. In embodiments, a height of example ball stacks can range from about 2 mil to about 90 mil.

Figure 3A:
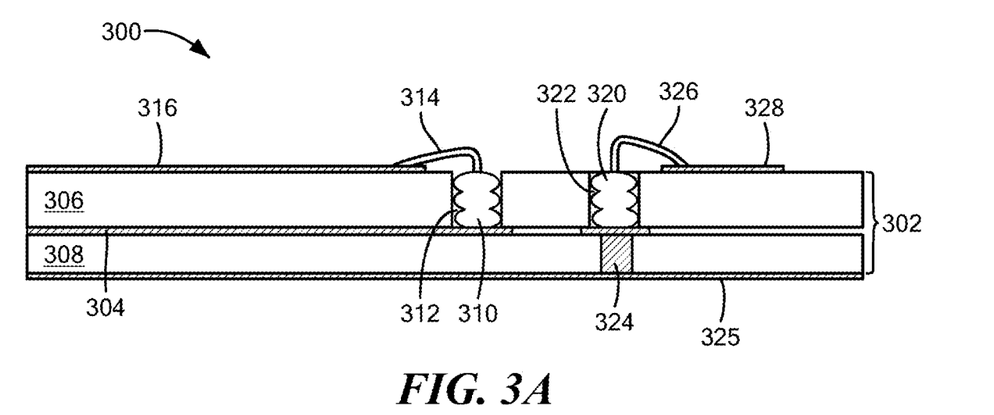
FIG. 3A is a cross-sectional view and FIG. 3B is a top view of an example RF interconnect having ball stacks to form connections.
Figure 3B:
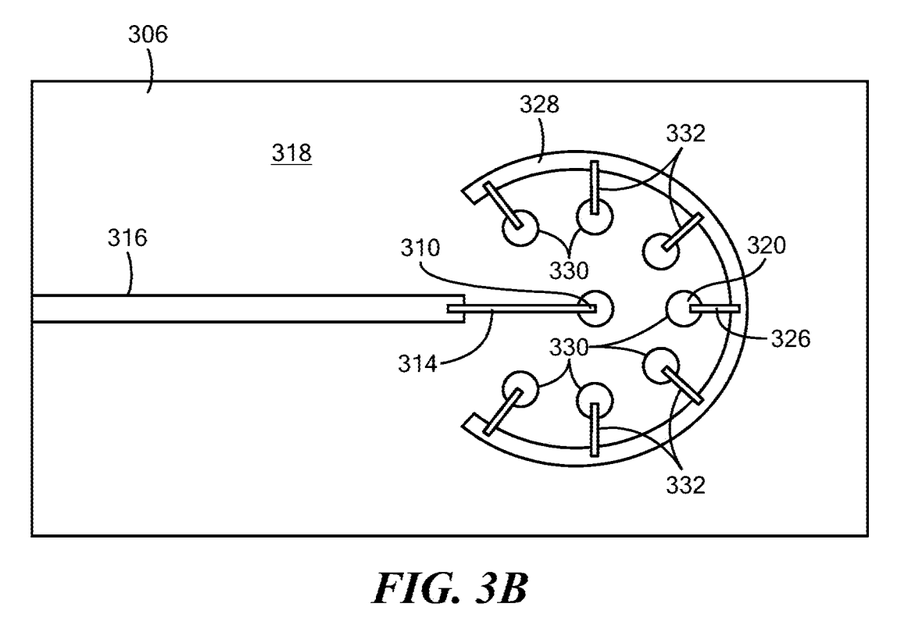

FIG. 3A shows a cross-sectional view and FIG. 3B shows a top view of a low-profile RF interconnect system 300. In the illustrated embodiment, a coaxial connector is formed. A printed wiring board (PWB) 302 includes a conductive layer 304 between first and second dielectric layers 306, 308. A first ball stack 310 is formed in a first hole 312 in the first dielectric layer 306 forming a connection to the conductive layer 304. A first wirebond 314 is connected to a top of the first ball stack 310 to a trace 316 on a top surface 318 of the PWB. In embodiments, the trace 316 provides a signal path for an RF signal for the coaxial interconnect.

As shown in FIG. 3A, a second ball stack 320 can be formed in a second hole 322 in the first dielectric layer 306. A plated through hole 324, e.g., a via, in the second dielectric layer 308 can provide a connection to a ground plane 325 under the second dielectric layer 308. A second wire bond 326 can be connected from the top of the second ball stack 320 to a ground pad 328.

As best seen in FIG. 3B, the ground pad 328 may form an arc with the first ball stack 310 located generally in the middle of the arc, which partially surrounds the signal-carrying first ball stack 310. In the illustrated embodiment, further ball stacks 330 similar to the second ball stack 320 and further wirebonds 332 similar to the second wirebond 326 are connected to the arcuate ground pad 328. It is understood that the arch in FIG. 3B is notional and the same ground effectiveness could be created by using pads instead of an arch.

In embodiments, the ball stacks 310, 320, 330, can be formed as described to efficiently and accurately form connections for interconnects, such as the illustrated low profile RF interconnect.

Figure 4A:
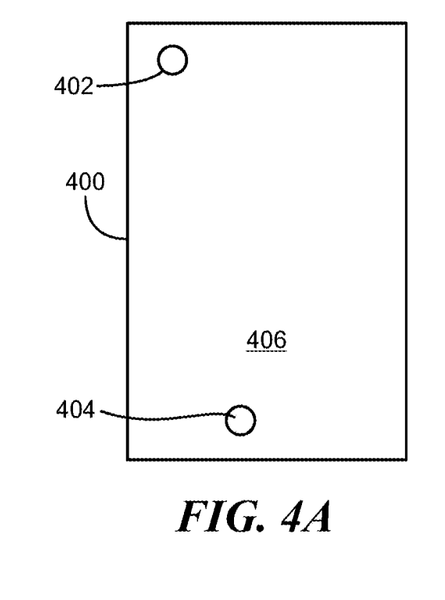
FIG. 4A is a top view and FIG. 4D is cross-sectional view of a first layer having locating features comprising ball stacks.
Figure 4B:
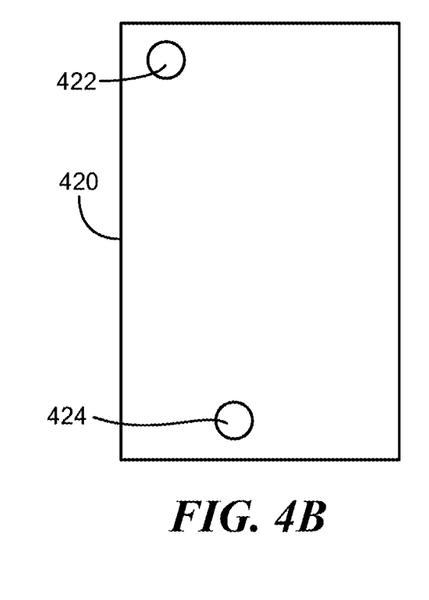
FIG. 4B is a top view and FIG. 4E is a cross-sectional view of a second layer having locating features comprising holes to align with the ball stacks while also providing poka-yoke keying feature to prevent incorrect orientation.
Figure 4C:
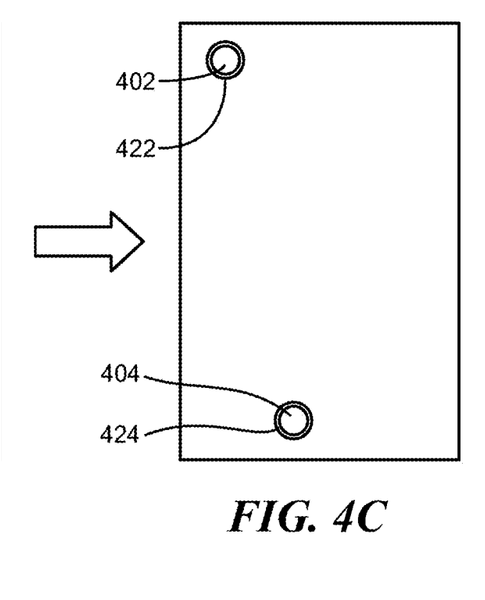
FIG. 4C is a top view and FIG. 4F is a cross-sectional view of the first and second layers mated together in a proper orientation.
Figure 4D:
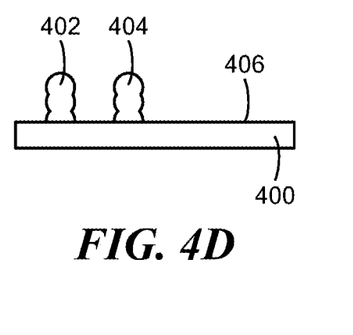
Figure 4E:
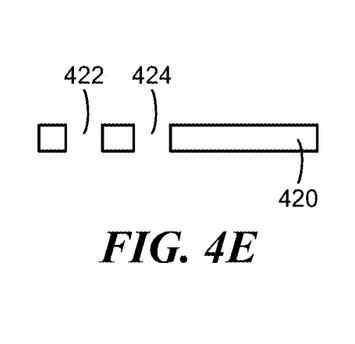
Figure 4F:
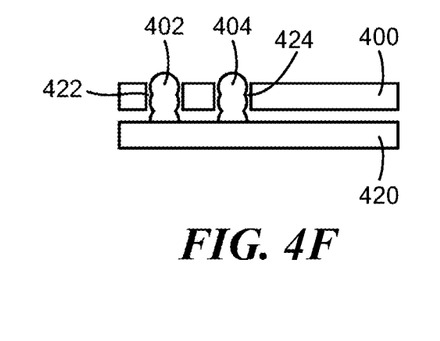

FIGS. 4A-C show top views and FIGS. 4D-F show cross-sectional views of example locating features provided by ball stacks in accordance with example embodiments. FIGS. 4A and 4D show a first PWB 400 having first and second locating features 402, 404 at specified positions. In the illustrated embodiment, first and second locating features 402, 404 comprise ball stacks having a given height and cross section. The first and second ball stacks 402, 404 extend up from a first surface 406 of the first PWB 400.

FIGS. 4B and 4E shows a second PWB 420 having third and fourth locating features 422, 424 at specified positions. In embodiments, the third and fourth locating features 422, 424 comprises a hole or depression the second PWB 420. In the illustrated embodiment, the third and fourth locating features 422, 424 comprise through holes at positions that align with the first and second locating features 402, 404 in the first PWB 400.

FIGS. 4C and 4F show the first and second PWBs 400, 420 mated together. As can be seen, the first and second PWBs 400, 420 can only be mated in a particular orientation due to the ball stack and hole positions so as to form a poka-yoke mechanism. As can be seen, the first ball stack 402 of the first PWB 400 extends into the third locating feature 422, which comprises an aperture, and the second ball stack 404 extends into the fourth locating feature 424, which also comprises an aperture.

In embodiments, the locating features 402, 404, 422, 424 can serve dual purposes. For example, the locating features 402, 404, 422, 424 can enforce correct orientation for mating the first and second PWBs. 400, 420, as well as provide electrical connections, as described above.

It is understood that the locating features can comprise any suitable geometry to meet the needs of a particular application. For example, the ball stacks 402, 404 can be generally round cross-sections with heights ranging from about 10 mil to about 90 mil in some embodiments. The third and fourth locating features 422, 424 can comprise an aperture, depression, slot, notch, channel, or the like to work in conjunction with the ball stacks 402, 404.

Figure 5A:
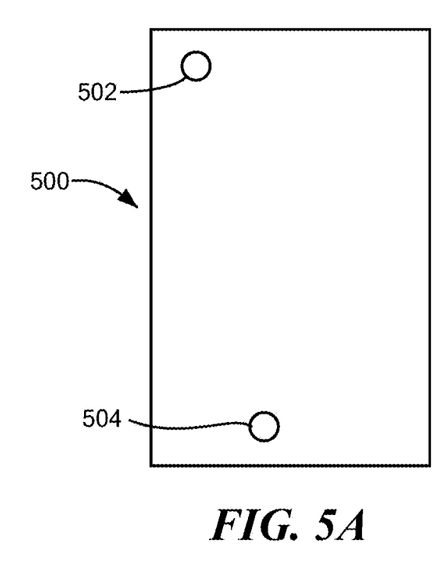
FIG. 5A is a top view and FIG. 5D is a side view of a PWB with ball stacks.
Figure 5B:
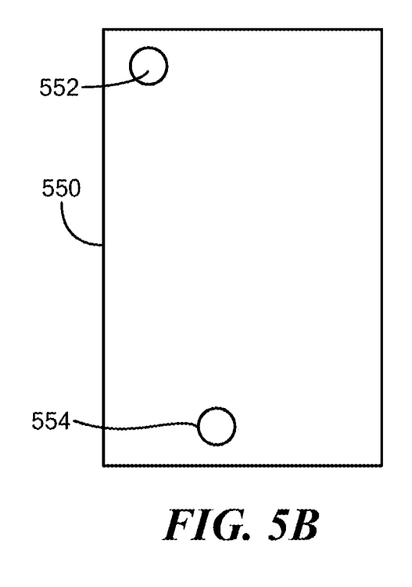
FIG. 5B is a top view and FIG. 5E is a cross-sectional view of a housing having locating features.
Figure 5C:
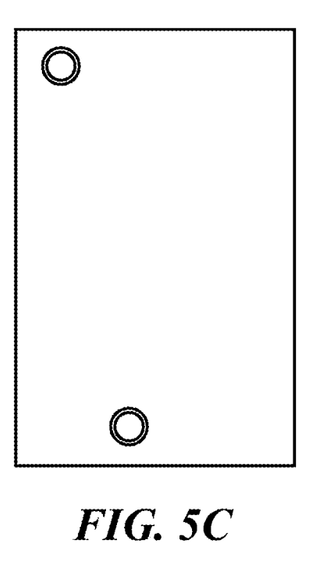
FIG. 5C is a top view and FIG. 5F is a cross-sectional view of the PWB of FIG. 5A and the housing of FIG. 5B mated together with proper orientation.
Figure 5D:
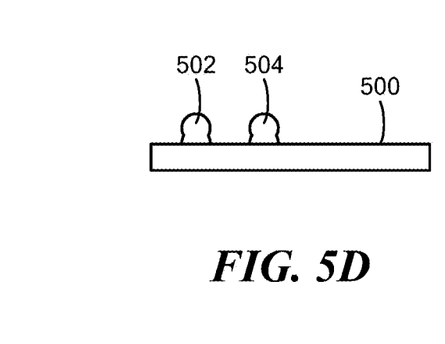
Figure 5E:
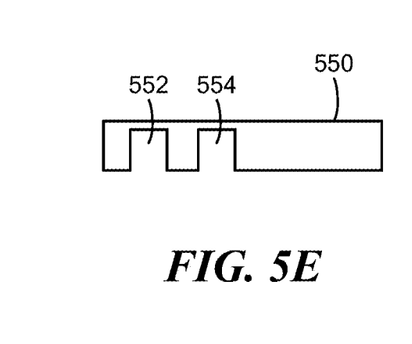
Figure 5F:
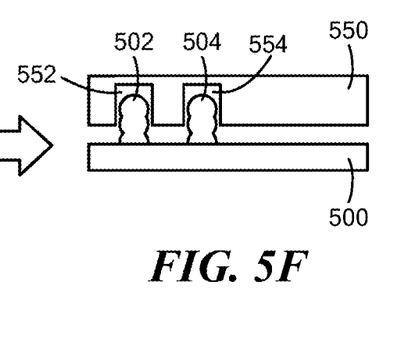

FIGS. 5A and 5D show respective top and side views of an example PWB 500 with first and second ball stacks 502, 504 that may be similar to the PWB 400 of FIG. 4A. The first and second ball stacks 502, 504 extend vertically, for example, from a surface of the PWB at predetermined locations. FIGS. 5B (top view) and 5E (cross-sectional view) shows a structure 550, such as a housing, frame, heatsink, or the like, in one embodiment having first and second blind holes 552, 554 aligned with the first and second ball sacks 502, 504 on the PWB. With this arrangement, the structure 550 may be secured to the PWB 500 in only one orientation, as shown in FIGS. 5C and 5F.

Figure 5G:
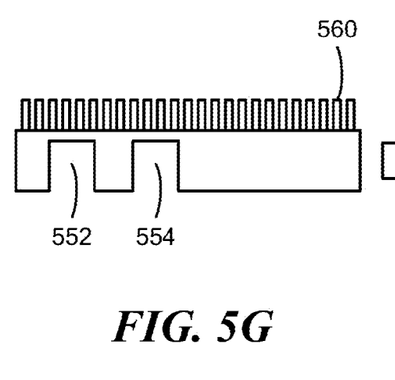
FIG. 5G is a cross-sectional view of a housing with a heat sink and FIG. 5H is a cross-sectional view of the housing of FIG. 5G mated to the PWB of FIG. 5A.
Figure 5H:
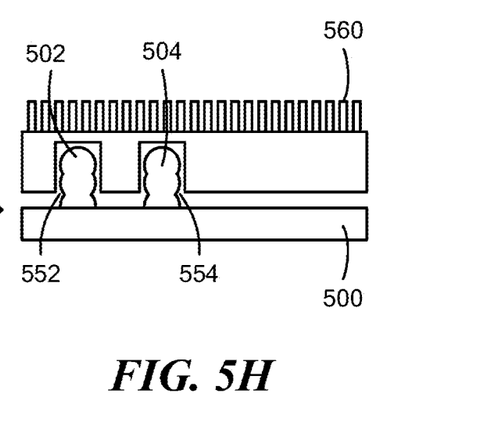

As shown in FIGS. 5G and 5H, a housing 550 can include a heatsink 560 to dissipate heat generated by the PWB 500. In the illustrated embodiment, the heatsink 560 comprises a series of ridges to increase surface for enhanced heat dissipation.

In embodiments, heights of the first and second ball stacks 502, 504 on the PWB can define a distance between the surface of the circuit card 500 and the housing 550. The height of the ball stacks can be selected to bring the housing closer or further away from the circuit card.

It is understood that the first and second ball stacks 502,504 can provide a given standoff distance or provide alignment of the housing and the circuit, or both.

Figure 6A:
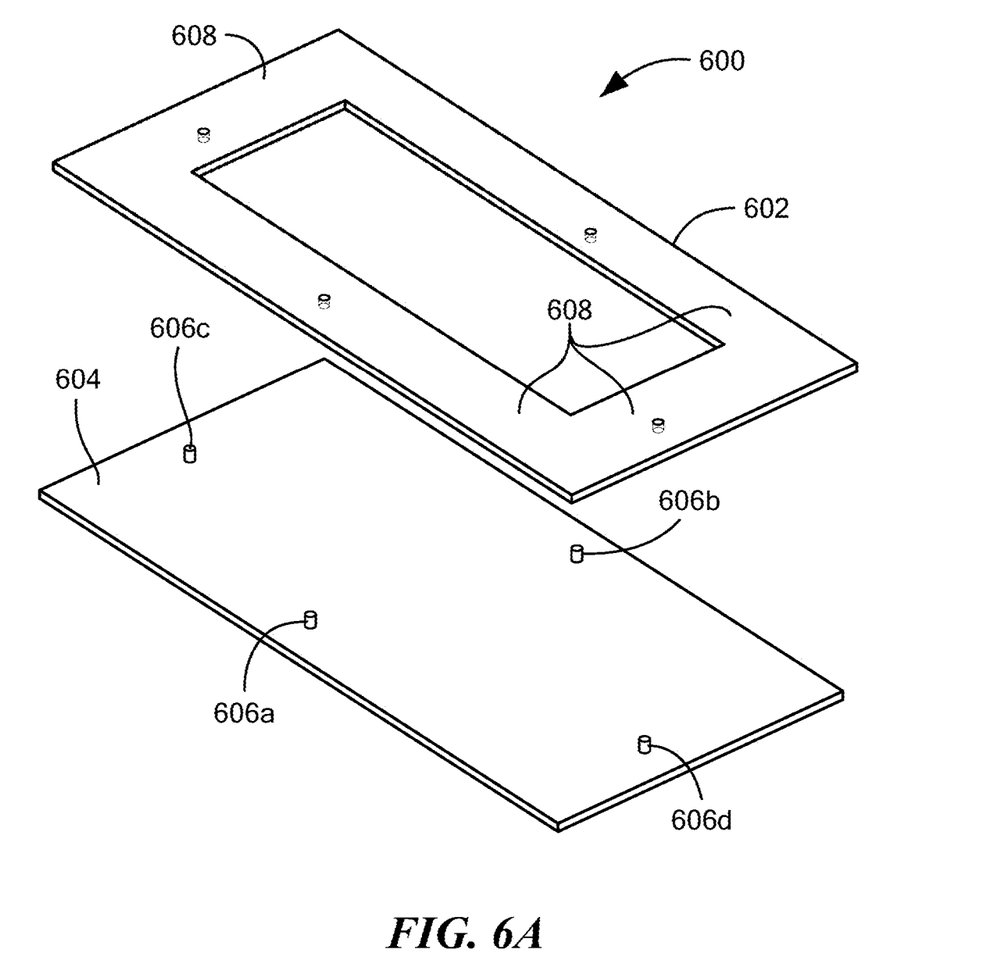
Figure 6B:
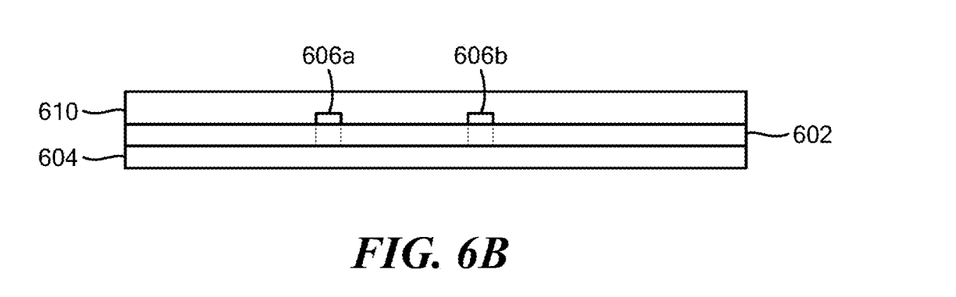
Figure 6C:
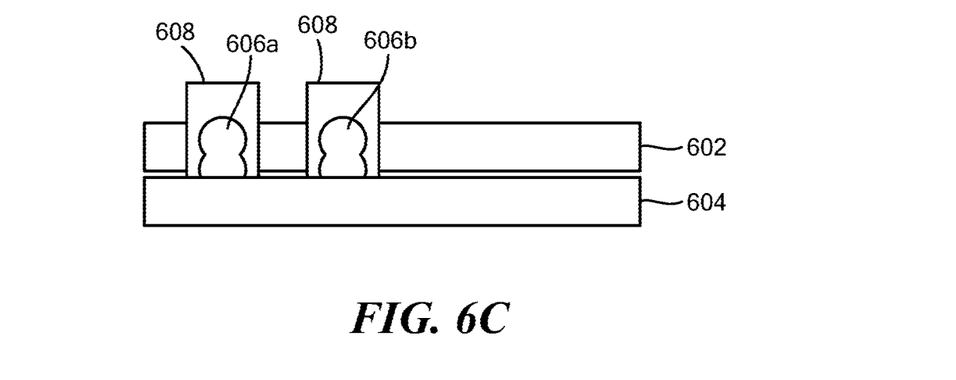
FIG. 6C is a cross-sectional view of an assembly having a gasket and housing with ball stacks to provide proper orientation and also positioning of the gasket for preventing it from sliding from under the mating surfaces.

FIG. 6A is an exploded perspective view, FIG. 6B is a side view, and FIG. 6C is a cross-sectional view of an assembly 600 including a gasket 602 secured to a housing 604 with a series of ball stacks 606 to ensure proper orientation of the gasket on the housing. In embodiments, the housing 604 includes the ball stacks 606 about a perimeter at specified locations. The gasket 602 includes through holes 608 at locations that align with the ball stacks 606. In other embodiments, blind holes can be used. The gasket 602 can only be seated on the housing when the ball stacks 606 align with holes 608. As can be seen, the ball stacks 606 are located at irregular locations. In one embodiment, the side ball stacks 606a,b are located at staggered distances. In other embodiments, the end ball stacks 606c,d are offset from each other to align with holes 608 and ends of the gasket. As can be seen in FIG. 6B, a layer 610, such as a complementary housing, can be secured to the assembly 600. The stud bump stacks also prevent the gasket from sliding out from under the mating surfaces.

In example embodiments, ball stacks are metallic and adhered directly to substrate metallization. Since they are created using a conductive material, they do not have a negative impact in the electrical or thermal performance of attached structures. Ball stacks may be thermosonically welded to the substrate metallization so as to form a strong metallurgical bond that is difficult to dislodge without a large applied force. In embodiments, ball stacks enable height validation for implementing statistical process control measures. In general, ball stacks are relatively inexpensive to manufacture compared to conventional alternatives and can be formed at relatively high rates of speed. In addition, ball stacks do not require separate components, such as washers, stand-offs, physical connector components, etc., which may be needed for conventional alternatives. Further, the geometry of the ball stacks can be controlled by changing wire size, process parameters and ball bonding tools. Once developed, the ball characteristics are extremely repeatable.

While relative terms, such as "vertical," "above," "below," "lower," "upper," "left," "right," and the like, may be used to facilitate an understanding of example embodiments, such terms are not to limit the scope of the claimed invention in any way. These terms, and any similar relative terms, are not to construed as limiting in any way, but rather, as terms of convenience in describing embodiments of the invention.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
   employing a first circuit card having first and second surfaces and including a first ball stack extending from the first surface of the first circuit card;
   employing a second circuit card having first and second surfaces and including a through hole, wherein the second circuit card is mated to the first circuit card to form an assembly, such that the first surface of the first circuit card faces the second surface of the second circuit card, wherein the first ball stack extends into the through hole; and
   employing a wirebond to connect the first ball stack to a bond pad on the first surface of the second circuit card, wherein the first and second ball stacks comprise at least two balls stacked on top of each other and bonded to each other, wherein the balls are generated from wire.

2. The method according to claim 1, wherein the assembly provides an electrical interconnect of the first and second circuit boards.

3. The method according to claim 1, wherein the first ball stack provides a signal connection and further including a further through hole and a further ball stack configured to provide a connection to a ground layer.

4. The method according to claim 1, wherein the first ball stack has a diameter that can range from about 1 mil to about 30 mils, and wherein the first ball stack has a height range that can range from about 2 mil to about 90 mil.

5. The method according to claim 1, wherein the first ball stack and the through hole are located to force the first and second circuit cards to be mated in a particular orientation for poka-yoke keying.

\* \* \* \* \*